United States Patent [19]

Harrington et al.

[11] 4,365,210

[45] Dec. 21, 1982

[54] DATA AND CLOCK RECOVERY SYSTEM HAVING A PHASE-LOCKED-LOOP AND WHICH CONTROLS DYNAMIC LOOP RESPONSE OF A DATA STREAM OF UNKNOWN DATA FORMAT

[75] Inventors: Wayne D. Harrington; Stanley E. Groves, both of Round Rock, Tex.

[73] Assignee: Motorola, Inc., Schaumburg, Ill.

[21] Appl. No.: 163,380

[22] Filed: Jun. 26, 1980

[51] Int. Cl.³ .......................... H03L 7/10; H03D 3/18
[52] U.S. Cl. ...................................... 331/1 A; 329/50; 331/17; 331/25; 360/51
[58] Field of Search ...................... 331/1 A, 17, 18, 25, 331/14; 360/51; 329/50, 122; 328/155

[56] References Cited

U.S. PATENT DOCUMENTS

| 3,688,210 | 8/1972 | Fort et al. | 331/14 X |
| 3,982,194 | 9/1976 | Chi et al. | 331/1 A X |
| 4,003,086 | 1/1977 | Larsen et al. | 360/51 X |
| 4,007,429 | 2/1977 | Cadalora et al. | 331/17 |
| 4,117,420 | 9/1978 | DeConinck et al. | 331/17 |
| 4,138,650 | 2/1979 | Anderson | 331/25 X |

Primary Examiner—Siegfried H. Grimm
Assistant Examiner—Edward P. Westin
Attorney, Agent, or Firm—Anthony J. Sarli, Jr.; Vincent B. Ingrassia; Robert L. King

[57] ABSTRACT

A data and clock recovery system for capturing and processing serial data of a type wherein data bits of an unknown format are interleaved with clock bits utilizes a phase lock loop capable of being operated in a capture mode or a tracking mode. The data stream is compared with an internally generated reference signal, and error pulses having widths proportional to the phase error are generated. In the capture mode, these error pulses are differentially processed to produce a control voltage which varies the frequency of a VCO which in turn alters the reference frequency. In the tracking mode, phase error pulses of fixed widths are processed only if the data bits occur in fixed windows. Differential amplifying means provide adjustable gain control of the error pulses. Means are provided for digitally controlling the loop's dynamic response when switching between the capture and tracking modes.

16 Claims, 27 Drawing Figures

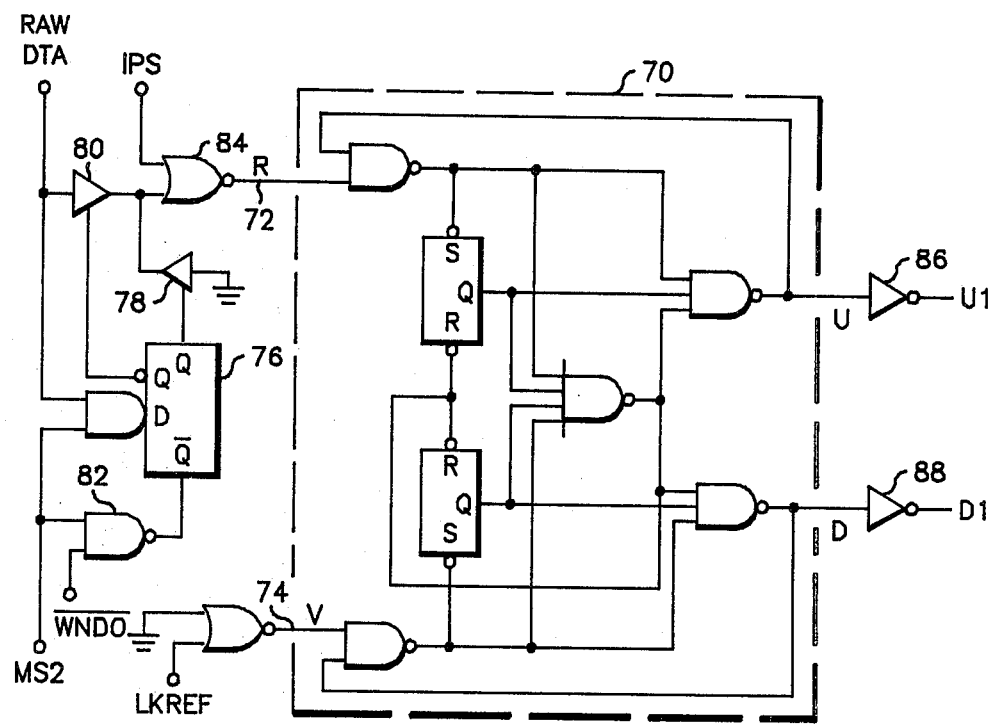
*Fig. 8a*
*Fig. 8b*
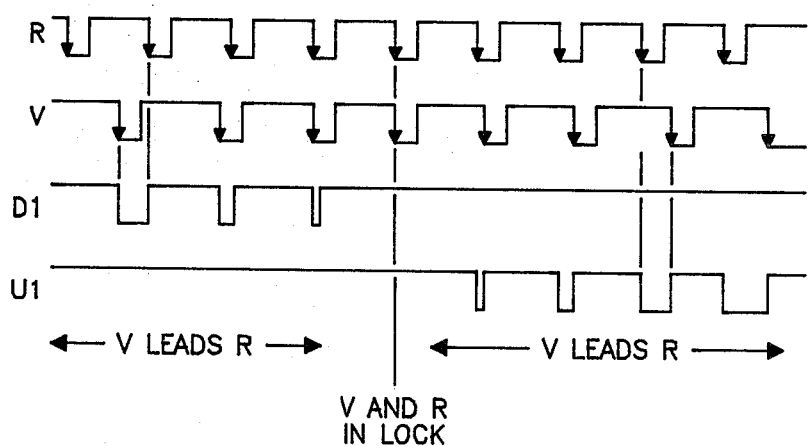

DATA AND CLOCK RECOVERY SYSTEM HAVING A PHASE-LOCKED-LOOP AND WHICH CONTROLS DYNAMIC LOOP RESPONSE OF A DATA STREAM OF UNKNOWN DATA FORMAT

BACKGROUND OF THE INVENTION

1. Field of the Invention

This invention relates generally to data processing systems and, more particularly, to an integrable data/clock recovery unit (DCRU) including a recovery phase-lock-loop (PLL) for capturing and processing serial data streams.

2. Description of the Prior Art

A common data encoding protocol used in serial, single channel, digital communication is comprised of the interleaving of digital data with write time-base (clock) pulses. The interval between the clock pulses is defined as a "bit cell", and the data bit usually resides in the middle of the bit cell. Repeated bit cells whose data contents are either all logic zeros or all logic ones, commonly referred to as "sync fields", are buried in the pulse streams to provide an opportunity for the recovery circuits to periodically synchronize.

Digital cassettes, digital magnetic tapes, floppy and hard disk and radio telemetry are all examples of systems which use the above described transmission protocol. Tapes and disks represent special cases which involve moving magnetic media, and which introduce significant time and phase distortion due to the mechanical nature of their design; e.g. the speed of a floppy disk can vary as much as plus or minus 10%. Such distortions in the data time-base impose severe performance burdens on data recovery and separation circuitry, especially in view of industry demands for increased data densities and data rates.

The phase-lock-loop (PLL) technique has proven to be the most reliable technique for data/clock recovery and separation. This approach utilizes a phase comparator, filter and voltage controlled oscillator (VCO) coupled in a feedback loop configuration in such a way that the VCO locks onto the phase and/or frequency of an incoming periodic wave form. Advances in semiconductor integrated circuit technology now permit such circuits to be integrated; however, known phase-lock-loops require circuits of moderate complexity and component count. Not only is performance often compromised in order to maintain the component counts at reasonable levels, but efforts thus far to produce integrated circuit PLLs have represented poor marriages between integrated analog and digital electronics resulting in loops of limited performance.

Several non-integrated techniques have been employed to improve loop performance by reducing loop phase jitter caused by loop electrical noise. A first approach utilizes torroids in the wires to the power supply leads of the loop filter and VCO. This, however, does not completely solve the problem caused by ground noise which itself will result in loop jitter. A second approach utilizes separate power supplies to drive the loop filter and VCO; a solution which is both costly and cumbersome. Prior art approaches to data recovery rely heavily on software techniques to reduce soft error rate. That is, a great deal of reliance is placed on error correcting codes and software routines to detect and correct soft errors. Additionally, prior art system performance has been limited in that phase tracking is generally dependent on input data format; i.e. irregular spaced data in certain designs cause loop tracking difficulties.

SUMMARY OF THE INVENTION

It is an object of the present invention to provide an improved data and clock recovery system employing a phase lock loop.

It is a further object of the present invention to provide an improved data and clock recovery system including both analog and digital components integrated on a single integrated circuit chip.

A still further object of the present invention is to provide an improved data and clock recovery system utilizing a PLL wherein common mode ground and power supply noise is substantially reduced by performing phase-to-voltage conversion with an unbroken differential analog processing path between a phase comparator and a VCO. Differential analog circuits provide high common-mode rejection.

Yet another object of the present invention is to provide an improved data recovery system utilizing a PLL having a wide control range VCO. A wide voltage-to-frequency control range produces a wide loop tracking range which is desirable when designing a loop that cannot be easily knocked out of lock by loop control voltage overshoots. To accomplish this, the invention utilizes a varactor diode tuned VCO. The varactor diode capacitance may be varied substantially with only a few volts of control voltage.

It is yet another object of the present invention to provide a data and clock signal recovery system utilizing a PLL providing digital control of loop bandwidth and dynamic response. This solves the prior art design compromise of fast capture or lock time for acquiring sync fields but slow release time following capture for stable tracking.

It is still another object of the present invention to provide a data and clock recovery system utilizing a PLL wherein phase tracking is independent of data format. This is accomplished using two modes of phase sampling called capture and tracking. In the capture mode, phase comparison logic is optimized for rapid phase and frequency lock to a brief sync field. Once lock is achieved, different logic optimized for stable tracking is switched into the loop. The tracking logic used in this design uses a technique which allows phase sampling of the data stream which contains irregularly spaced data, and as such, permits tracking which is independent of data format. Phase sampling during the tracking mode is accomplished by comparing time-differences between the edges of the VCO reference and raw disk data pulses which occur within a time window. If the two comparison edges do not occur within the window (irregularly spaced data) the sample is determined to be invalid and is not used in the averaging process. Such irregularly spaced data pulses occur with both MFM and MMFM disk data formats. This sampling technique combined with digital control which lowers loop bandwidth produces significantly improved recovery performance.

Finally, it is an object of the present invention to provide a general purpose data and clock recovery system which is useable over a wide range of frequencies; i.e. one which can accommodate serial data from digital cassettes, digital magnetic tape, floppy and hard disk, radio telemetry, etc., or any serial data source which generates a serial data stream having sync fields and clock bits interleaved with data bits.

According to a first aspect of the invention, there is provided a phase-lock-loop circuit for generating a reference signal which is in phase with an input signal, comprising: comparing means for receiving said reference signal and said input signal and for generating an error signal indicative of the phase difference between said reference signal and said input signal; first means coupled to said comparing means for generating said reference signal, said first means being responsive to said error signal for bringing said reference signal into phase with said input signal; and second means for inhibiting the generation of said error signal if said input signal falls outside a predetermined interval of time.

According to another aspect of the invention there is provided a data recovery system for capturing and tracking a serial data stream including a synchronization field and clock bits interleaved with data bits, comprising: phase lock loop means for synchronizing a reference signal with said synchronization field during a capture mode of operation and for tracking said clock and data bits during a tracking mode of operation; and first means for increasing the dynamic response time of said loop means during said capture mode to achieve rapid phase and frequency lock to said synchronization field and for decreasing the dynamic response time of said loop means during said tracking mode.

According to a still further aspect of the invention there is provided a data recovery system including a phase lock loop to capture and track a serial data stream including a synchronization field and clock bits interleaved with data bits, comprising: first means for generating a reference signal; comparison means coupled to said first means for receiving said data stream and said reference signal and for generating error pulses of a first type indicative of the phase difference between bits of said data stream and pulses of said reference signal; second means coupled to said comparison means and responsive to the error pulses of said first type for generating error pulses of a second type if each of said bits occurs during predetermined intervals; adjustable gain differential amplifying means; third means for selecting the error pulses of said first type when said system is operating in a capture mode and for selecting the error pulses of said second type when said system is generating in a tracking mode and for applying selected error pulses to said amplifying means; fourth means for decreasing the dynamic response time of said loop in said capture mode and for increasing the dynamic response time of said loop in said tracking mode; and fifth means responsive to said error pulses for altering said reference signal to bring said reference signal into phase with said data bits.

The above, and other objects, features and advantages of the present invention will be more clearly understood from the following detailed description taken in conjunction with the accompanying drawings, in which:

BRIEF DESCRIPTION OF THE DRAWINGS

FIG. 8A is a logic diagram of the capture phase comparator, and FIG. 8B is a timing diagram relating thereto;

DESCRIPTION OF THE PREFERRED EMBODIMENT

Figure 1:
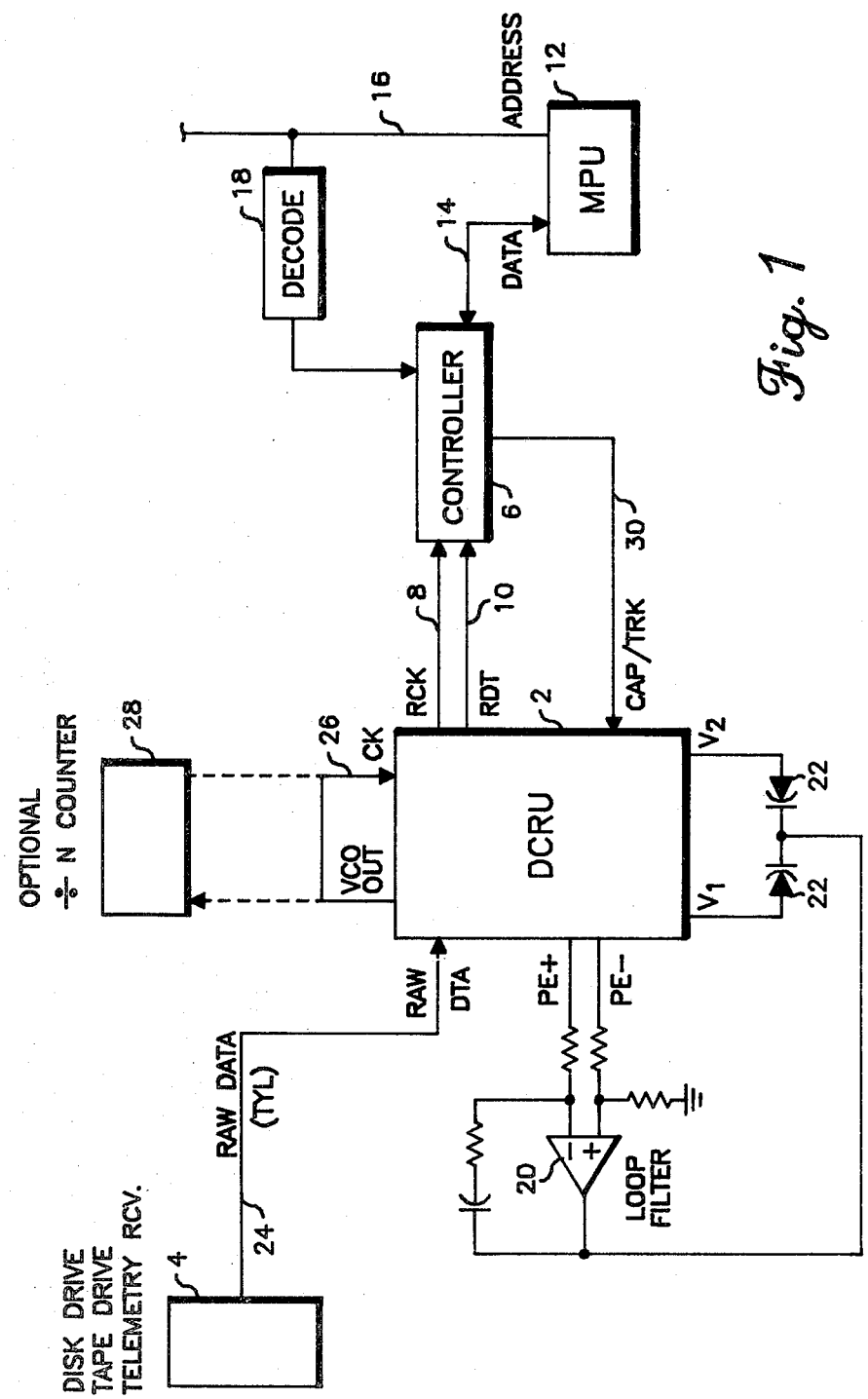
FIG. 1 is a functional block diagram of a typical microprocessor system including a data/clock recovery unit (DCRU)

FIG. 1 is a partial block diagram illustrating a typical microprocessor system including a data/clock recovery unit (DCRU) 2 coupled between a disk or tape drive unit 4 and controller logic 6. Controller 6 receives recovered data (RDT) and recovered clock signals (RCK) from DCRU 2 over lines 8 and 10 and converts the serial data to parallel data which is applied to a microprocessing unit 12 via data bus 14. In a write mode, MPU 12 supplies parallel data to controller 6 via bus 14, and supplies address data to controller 6 via address bus 16 and decode unit 18.

The loop filter comprises a differential active filter 20 whose output voltage controls a voltage-controlled-oscillator (VCO) inside the DCRU 2 by controlling the reverse bias capacitance of varactor diodes 22. The inputs to amplifier 20 (PE+ and PE−) are generated by a differential pulse amplifier inside the DCRU and having an output which is a phase error status pulse. That is, the polarity of the output pulse indicates the presence of either a plus, minus or zero phase error between the raw data input applied to the DCRU over line 24 and a signal derived from the output of the VCO. A D.C. voltage component of these status pulses is extracted by filter 20 and represents the filter output control voltage to the VCO.

As can be seen, the VCO output forms a clock signal (CK) which may be applied to the DCRU via line 26. An optional divide-by-N counter provides a means for producing the constant division ratio between the VCO operating frequency and the incoming raw data frequency. This provides flexibility in the choice of the VCO varactors and in the establishment of loop stability parameters.

Capture and tracking of a serial data stream on line 24 is accomplished by a handshake operation between controller 6 and DCRU 2. The DCRU is initially placed in a capture mode by controller 6 during which the controller searches for a buried sync field. Capture mode operation is initiated when controller 6 places a logical 1 voltage level on CAP/TRK line 30. Controller 6 searches for the sync field by counting, for example, a contiguous number of either logical zero or logical one data received by the controller from the DCRU. After a predetermined number of zeros or ones have been counted, a "contiguous zero (one) counter" within the controller dead-end counts and switches the DCRU to a tracking mode by placing a logical zero voltage level on line 30. Logic within controller 6 then begins looking for address mark fields which usually follow the sync fields. If the address mark fields are not found, then the preceding stream encountered by the DCRU was not a valid sync field but just an extended field of zero or one data. In this case, controller 6 switches DCRU back into the capture mode to again search for a valid sync field. If, on the other hand, the address mark fields are detected, the DCRU remains in the tracking mode until resynchronization is again necessary.

Figure 2A:
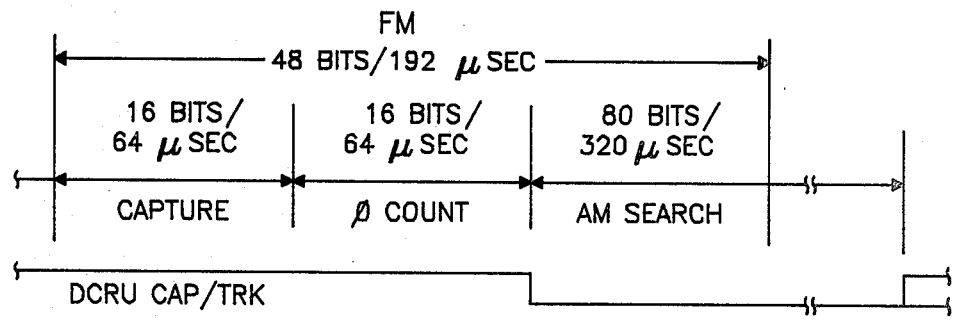
FIGS. 2A and 2B are timing diagrams illustrating a handshake operation between the DCRU and the controller shown in FIG. 1.
Figure 2B:
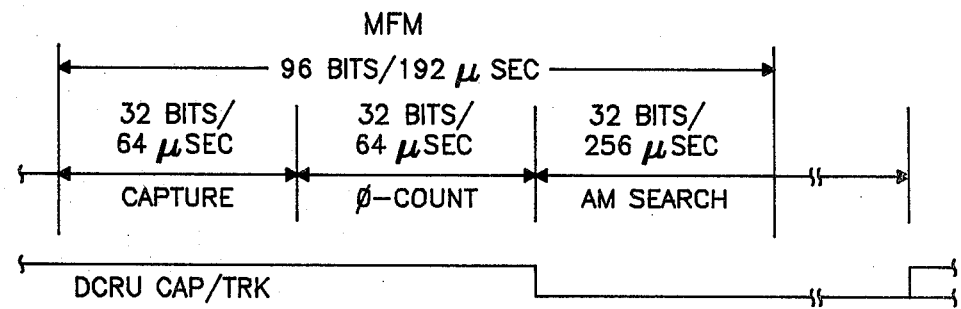

FIGS. 2A and 2B illustrate the timing involved in the handshake operation between the DCRU 2 and a floppy disk controller of the type available from Western Digital and bearing model number 1791. FIGS. 2A and 2B illustrate the timing for single density (FM) and double density (MFM) formats respectively. Referring to FIG. 2B the MFM field comprises a total of 96 bit cells and is 192 microseconds in duration. The DCRU capture interval is assumed to be 32 bits or 64 microseconds in duration. The controller must count 32 bit cells of contiguous zero data following capture before making the decision to switch the CAP/TRK low thus placing the DCRU in the tracking mode. The final interval is the address mark search interval for which the controller allows 128 bit cells or 256 microseconds to recognize an address mark. If no address mark is found, the controller switches the DCRU back to the capture mode. If the address mark is detected, the CAP/TRK signal is left low.

During the capture mode, the DCRU exhibits a very fast PLL transient phase response time so that phase lock to a sync field may be accomplished in a minimum amount of time. In contrast, during the tracking mode, the DCRU is characterized by an increased transient phase response time along with a method of gating incoming raw data. This is accomplished through the use of "smart window" phase tracking logic which will be described in detail hereinafter. The smart window logic allows the system to tolerate many noncontiguous or irregular interval pulses associated with some data formats which would ordinarily introduce invalid phase comparisons and rapidly throw prior art PLL designs out of lock.

Figure 3:
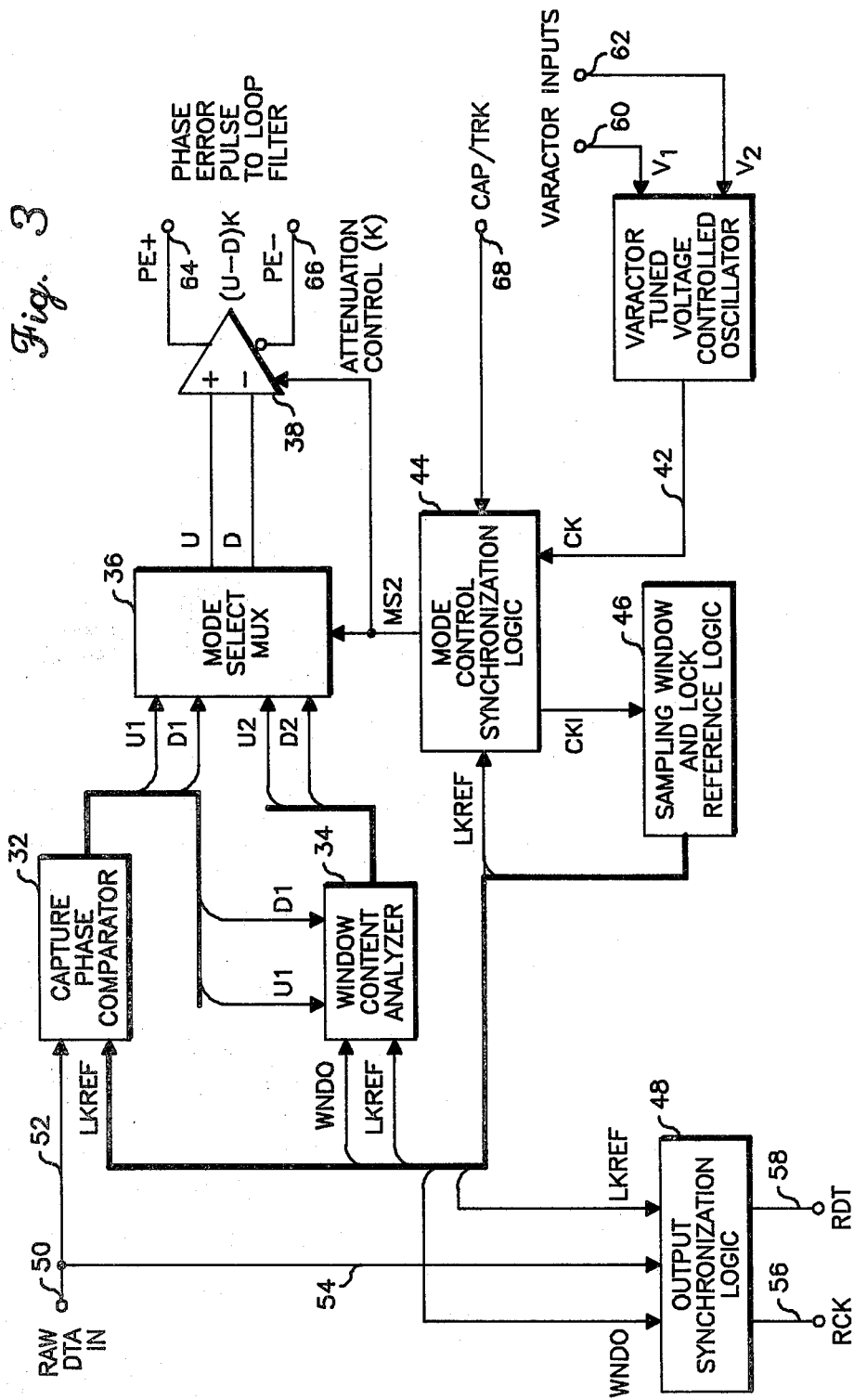
FIG. 3 is a functional block diagram of a DCRU in accordance with the present invention.

FIG. 3 is a functional block diagram of the DCRU shown in FIG. 1. The loop is formed by (1) phase comparison logic including capture phase comparator 32, window content analyzer 34 and mode select multiplexer 36; (2) a phase-to-voltage converter including output differential amplifier 38 and the external loop filter (20 in FIG. 1); (3) VCO 40; and (4) the feedback path between the VCO output and the DCRU clock input (CK). If the optional divide-by-N counter is not employed, the feedback path may simply include a wire connection 42 from the varactor tuned VCO output to the clock (CK) input of mode control sync logic 44. The DCRU also includes sampling window and lock reference logic 46 and output synchronization logic 48. The raw data input from the disk drive is received at terminal 50 and applied via line 52 to capture phase comparator 32 and via line 54 to output synchronization logic 48 which in turn generates signals corresponding to the recovered data (RDT) and the recovered clock (RCK) at terminals 56 and 58 respectively.

The recovered clock is an output square wave which represents the raw data time base averaged by the PLL. The valid average period is established during the capture mode within a sync field. When stable phase lock is established, the rising edge of RCK is locked to the rising edge of each raw data pulse. Either edge of RCK may be used by controller 6 (FIG. 1) to strobe the presence of RDT. The recovered data is an echoed image of the raw serial input data latched during a sample window interval and then applied to terminal 58 as a pulse synchronous with the next RCK edge following the window. The recovered data is thus synchronized to its own strobe signal.

The varactor diodes shown in FIG. 1 are coupled to terminals 60 and 62 for applying voltages V1, V2 to VCO 40, and the phase-error differential pulse generated by amplifier 38 appears across terminals 64 and 66. These phase-error pulse differential outputs (PE+, PE−) are applied to the inputs of external loop filter 20 (FIG. 1) whose output produces the VCO control voltage. The filtered value of the control voltage is a function of both the amplitude and width of the error pulse. During the capture mode, the pulse width is proportional to phase error while during the tracking mode, the pulse width is constant and equal to one period of the input clock (CK). Positive polarity pulses direct the VCO to increase its frequency while negative polarity pulses direct a decrease in frequency.

In the capture mode, the external control signal CAP/TRK received at terminal 68 causes mode control sync logic 44 to produce a logical one at output MS2 which is applied to both mode select multiplexer 36 and differential pulse amplifier 38. Output MS2, when in a logic one state, directs mode select multiplexer 36 to pass output pulses (U1 and D1) from capture phase comparator 32 to the output pulse differential amplifier 38. Signal MS2 also controls the attenuation factor of amplifier 38. Loop dynamic response time is directly related to phase error pulse amplitude and is therefore controllable by the state of MS2.

Minimum attenuation is desired in the capture mode in order to produce maximum phase error pulse amplitudes, thus creating a fast loop response time required for sync field phase lock. In addition, the outputs U1 and D1 of capture phase comparator 32 which are passed to amplifier 38 are pulse width modulated with a pulse width proportional to the phase error. These width modulated pulses are capable of generating large DC control voltages after filtering and, as a result, correct the VCO in a minimum of phase samples thereby additionally contributing to the fast lock time desired. Phase lock occurs between edges of the raw data pulses applied to a first input of phase comparator 32 and an internally generated VCO reference signal (LKREF) generated by sampling window and lock reference logic 46 and applied to a second input of capture phase comparator 32. The phase comparison action of the capture phase comparator produces both frequency and phase lock.

The tracking mode of operation is initiated when the controller switches the CAP/TRK signal to an opposite logic state from that of the capture mode. This action clears the internal control signal MS2 which causes mode select multiplexer 36 to steer signals U2 and D2 from window content analyzer 34 to amplifier 38 instead of pulses U1 and D1 as was the case in the capture mode. It should be noted, however, that U1 and D1 from capture phase comparator 32 are still applied as first and second inputs to window content analyzer 34. The switching of MS2 also switches the amplifier attenuation factor of amplifier 38. This greatly increases the overall loop tracking response time due to a reduction in VCO control voltage increment per sample cycle from the loop filter output. This increased tracking response time is desirable in order to produce a stable sampling window following capture and lock.

Figure 4C:
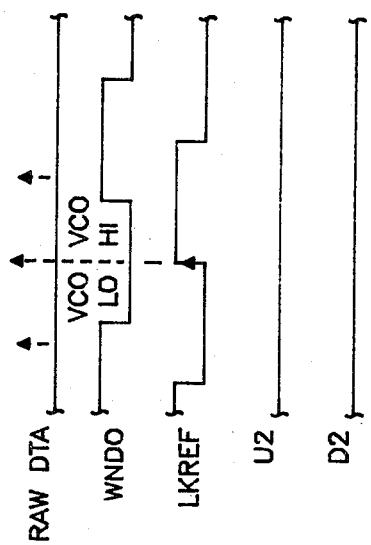
FIGS. 4A-4D are timing diagrams illustrating the phase sampling function.
Figure 4D:
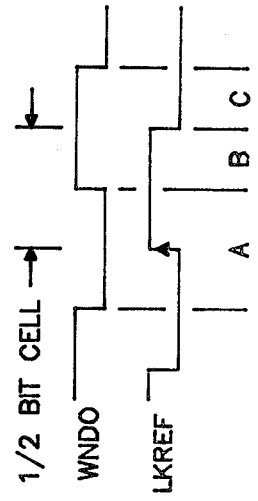
Figure 4A:
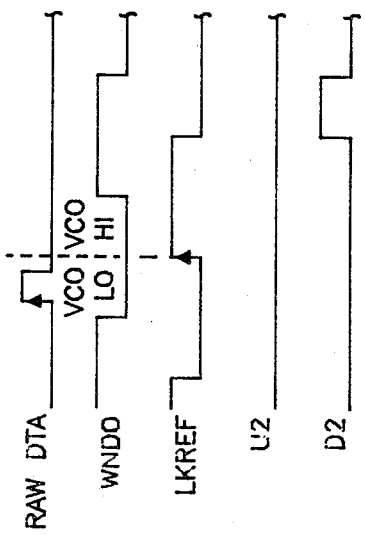
Figure 4B:
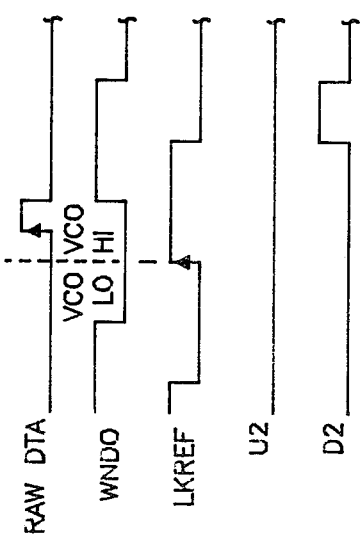
Figure 5:
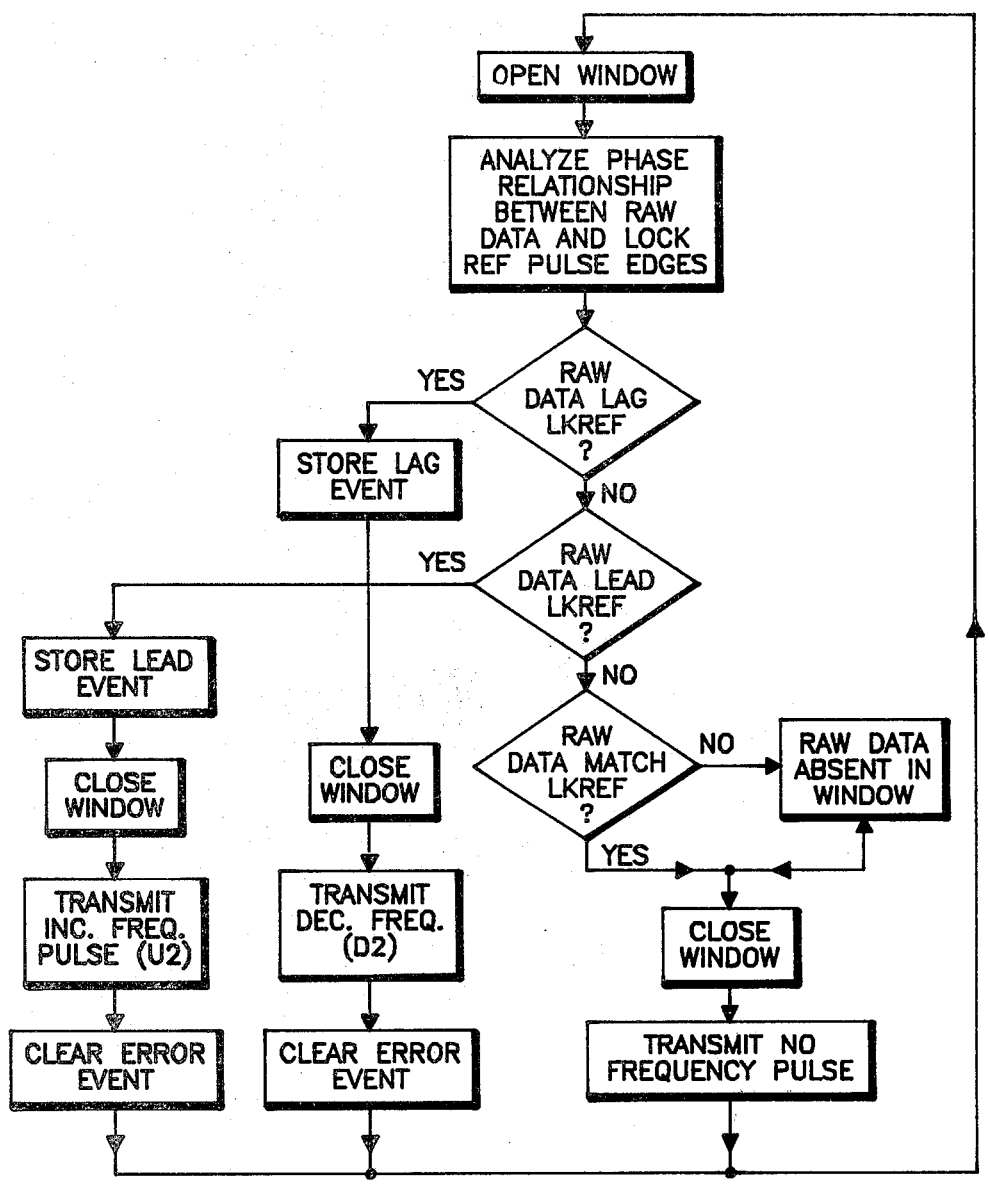
FIG. 5 is a flowchart which describes the tracking algorithm utilized by the inventive DCRU.

Window content analyzer 34 and its associated logic produces a "smart window" which is used in the phase sampling function. FIGS. 4A–4D are waveforms illustrating the smart window phase sampling function. As can be seen, a window (WNDO0) opens for each half bit cell. The window samples current loop phase status by using either clock or data bit pulse edges present within the window. Each window is divided into two portions by the rising edge of a lock reference pulse (LKREF). The left portion of the window is defined as a VCO frequency low region, and the right portion is a VCO frequency high region. The region division defined by the rising edge of LKREF represents the perfect lock reference point. The detection of a raw data pulse edge in either of the two regions is stored for use during the resolution interval defined as interval B in FIG. 4D. Interval A in FIG. 4D represents a sample interval and interval C represents an output interval. An increment (U2) or decrement (D2) VCO frequency command is transmitted during the output interval depending upon in which region the raw data pulse edge was detected during the sample interval. In FIG. 4A, it can be seen that the rising edge of the raw data pulse falls within the "VCO low" region of the window. Thus, a pulse U2 is generated during the output interval to direct the VCO to increase its frequency. In FIG. 4B, the raw data edge appears in the VCO high region of the window and thus a signal D2 is generated to direct the VCO to decrease its frequency. In FIG. 4C, it can be seen that the raw data edge is coincident with the rising edge of LKREF and therefore neither a U2 nor a D2 pulse is generated. FIG. 5 is a flowchart which summarizes the tracking algorithm described above.

The DCRU outputs, RCK and RDT (appearing at terminals 56 and 58 respectively in FIG. 3) represent the separated data and timing information used by controller 6 in FIG. 1. The period of RCK is, in effect, a cycle-by-cycle average bit cell duration derived by the PLL action of the DCRU. It is initially established by phase and frequency lock to sync field pulses (usually clock pulses only) in the capture mode. This average is then maintained during the tracking mode by the smart window phase sampling process.

Figure 6:
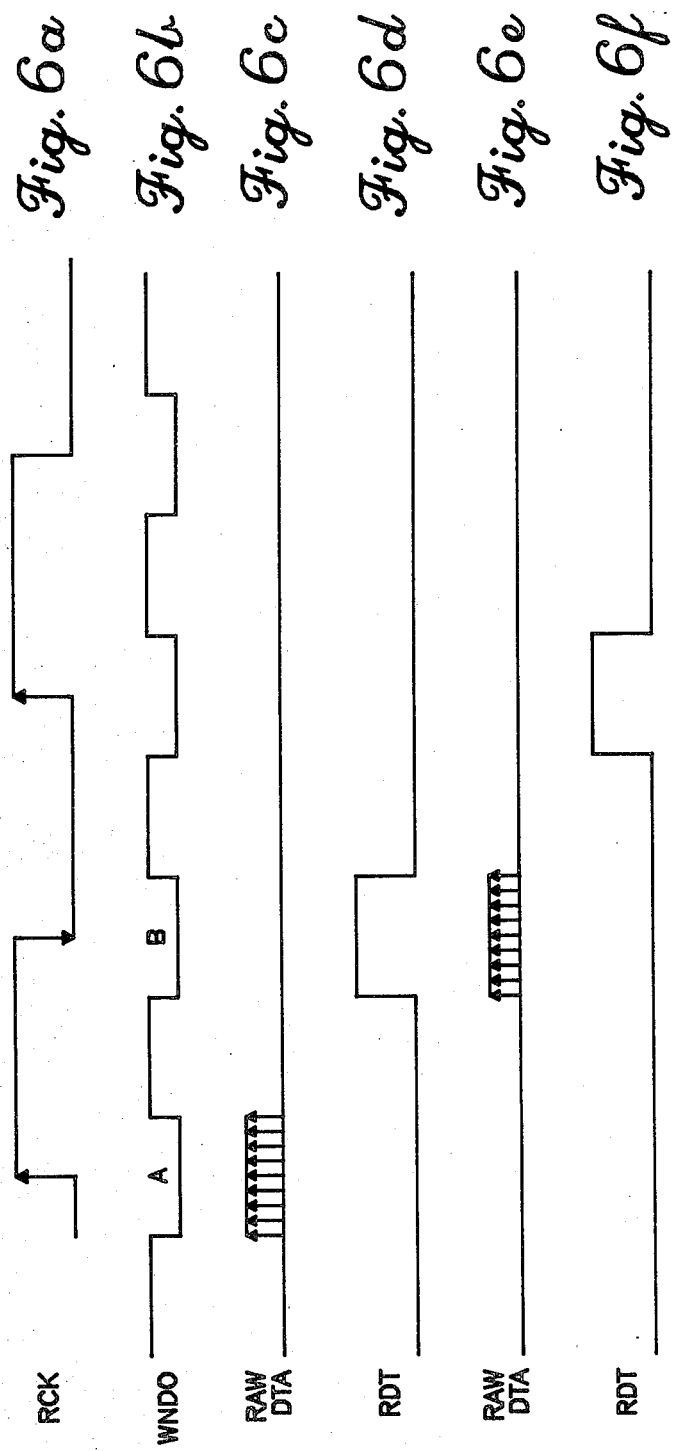
FIGS. 6A-6F are timing diagrams illustrating the relationship between the recovered clock and recovered data during the capture and tracking modes.

FIGS. 6A–6F illustrate the timing relationships required between RCK and RDT for either the capture or tracking mode of operation. FIGS. 6A and 6B illustrate the timing relationship between RCK and the internal pulse window (WNDO). A sampling window is opened which encompasses each RCK edge. Raw clock or data may appear in either window A (FIG. 6C) or in window B (FIG. 6E). The presence of any raw data that occurs in either window sets an occurrence latch which synchronizes the RDT pulse so as to be referenced to the next RCK edge as shown. That is, RDT is referenced to the opposite edge of RCK in which the raw data was detected. For example, in FIG. 6C, raw data was detected during the rising edge of RCK. The resultant RDT shown in FIG. 6D is referenced to the falling edge of RCK. Similarly, in FIG. 6E, the raw data is referenced to the falling edge of RCK. The resultant RDT pulse shown in FIG. 6F is referenced to the next rising edge of RCK. Since RCK and RDT are both derived from the internal VCO clock, the phase relationship between them is a constant which allows the controller to receive very stable data pulses by using either edge of RCK as a strobe to sample RDT logic states.

Figure 7:
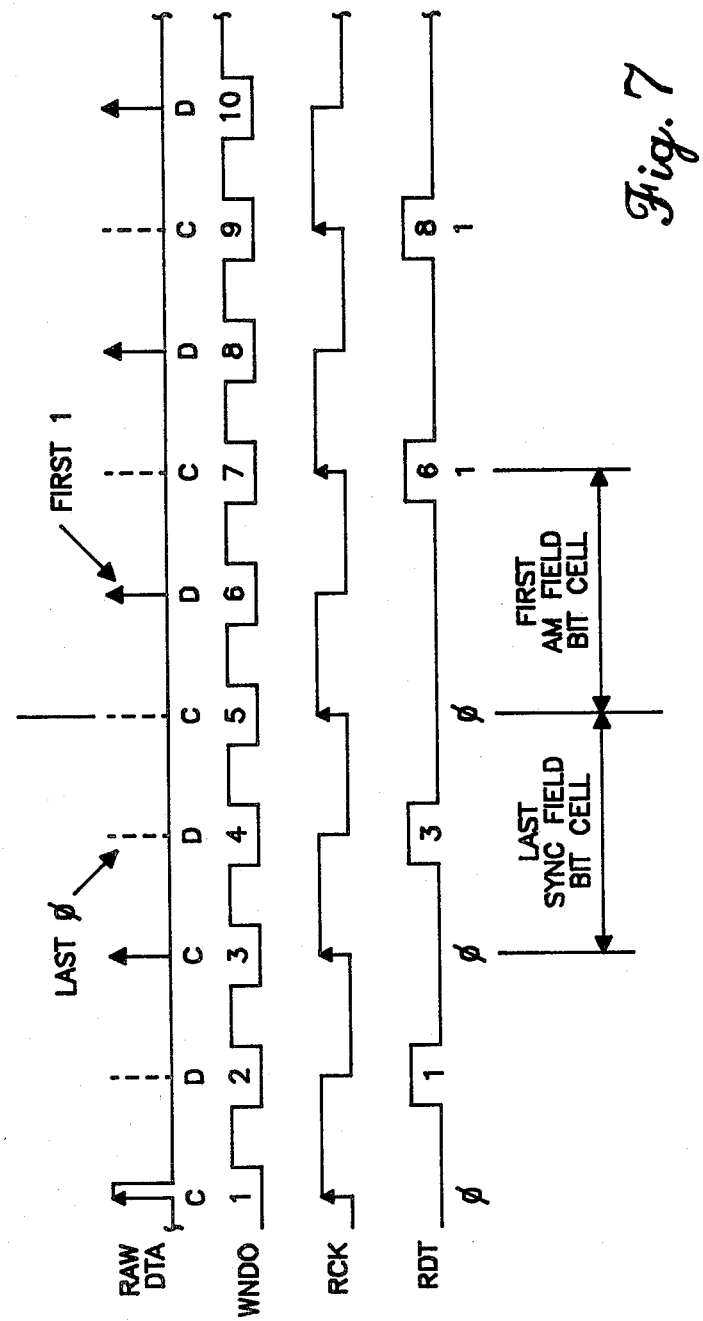
FIG. 7 is a timing diagram illustrating the recovery of a double-density floppy-disk data stream.

FIG. 7 further illustrates the timing relationship required between the recovery clock and recovered data outputs, and demonstrates recovery of a double density floppy disk data stream. FIG. 7 is, in effect, a time snapshot which shows the sync field-address mark boundary. The last two sync field zeros are followed by the first two address mark field ones. The controller in this case samples data (RDT) with the rising edge of RCK with the DCRU in the tracking mode. Output RCK is phase locked to the rising edge of each clock pulse. This was accomplished at the beginning of the sync field during the capture mode since the sync field contains only clocks. It is to be noted that with the double density data format, clocks are only inserted at the bit cell boundaries whose contents are consecutive zeros. The DCRU outputs an RDT pulse for each raw data edge seen during WNDO low. Raw data edges are seen in windows one, three, six and eight. It is to be noted that sampling with the rising edge of RCK recovers data bits while falling edge sampling recovers clock bits.

FIGS. 8A and 8B illustrate a logic diagram and associated timing of an arrangement suitable for use as the capture phase comparator shown as 32 in FIG. 3. Circuit 70 is essentially an asynchronous sequential logic element which outputs pulses having widths which are proportional to the arrival time difference of pulse edges R and V applied to its two inputs 72 and 74. The first half of FIG. 8B represents the situation when input V leads input R. It is to be noted that pulses D1 are generated which in the present system will direct the VCO to reduce its frequency. As the phase of the VCO signal approaches that of the raw data input signal, the width of pulses D1 will decrease until V and R are in lock. This situation is shown at the center of FIG. 8B.

The right half of FIG. 8B represents a situation where V lags R. In this case, U1 pulses will be generated and no D1 pulses will be generated. The circuitry found in block 70 of FIG. 8A is commercially available from Motorola Inc. as a standard small scale integrated component bearing part number MC4044. The phase comparison function provided by block 70 provides both frequency and phase lock when connected in a PLL.

Supplemental logic is shown which "windows" the incoming raw data by using a transparent latch 76 and three-state buffers 78 and 80. Incoming data is allowed to reach the R input only after the "window" opens (WNDO applied to a first input of NAND gate 82 goes high). During the capture mode, the window is effectively always held open by signal MS2 which is an internally synchronized version of CAP/TRK and remains a logic 1 during the capture mode. This signal is applied to the second input of NAND gate 82. Signal IPS applied to a first input of NOR gate 84 goes high when no raw data edge occurs within the window. This signal will be described further below. The outputs of block 70 are inverted by inverters 86 and 88 to produce the U1 and D1 pulses.

Figure 9A:
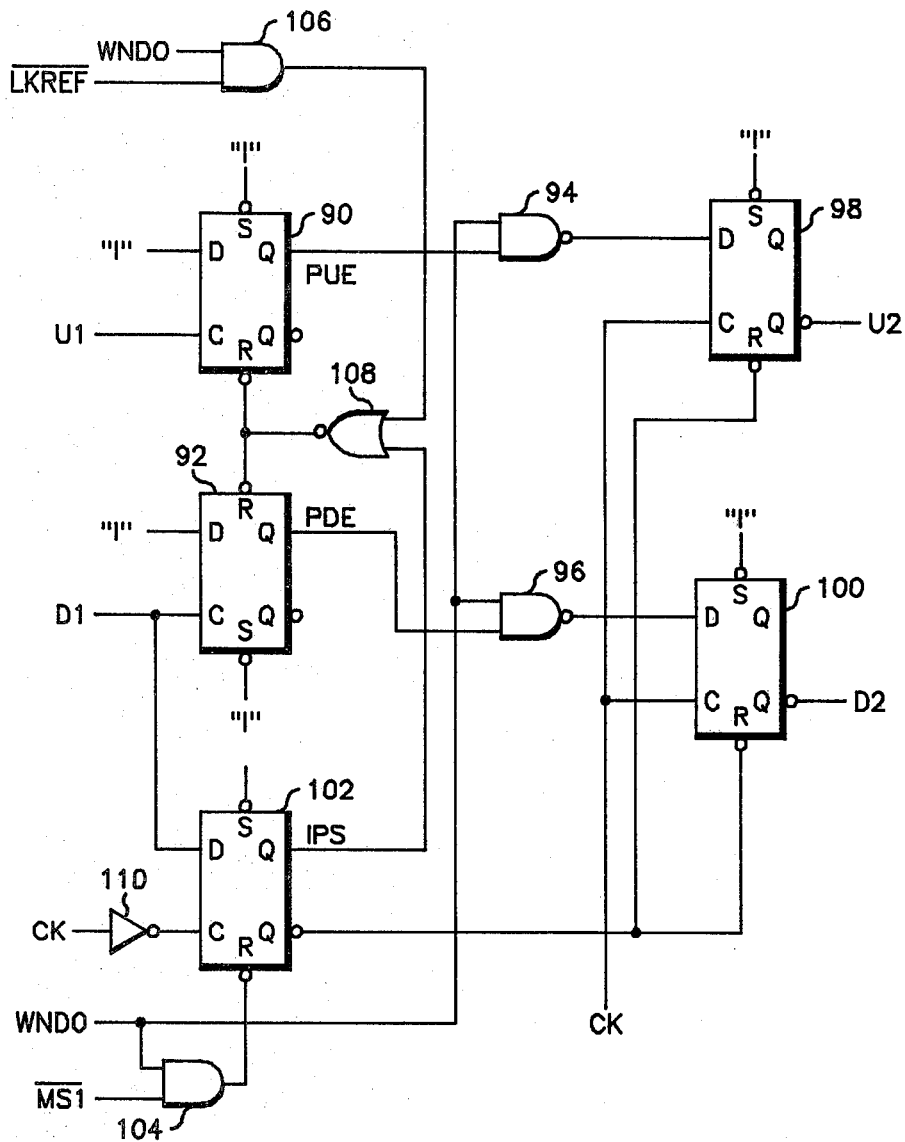
FIG. 9A is a logic diagram of the window content analyzer.
Figure 9B:
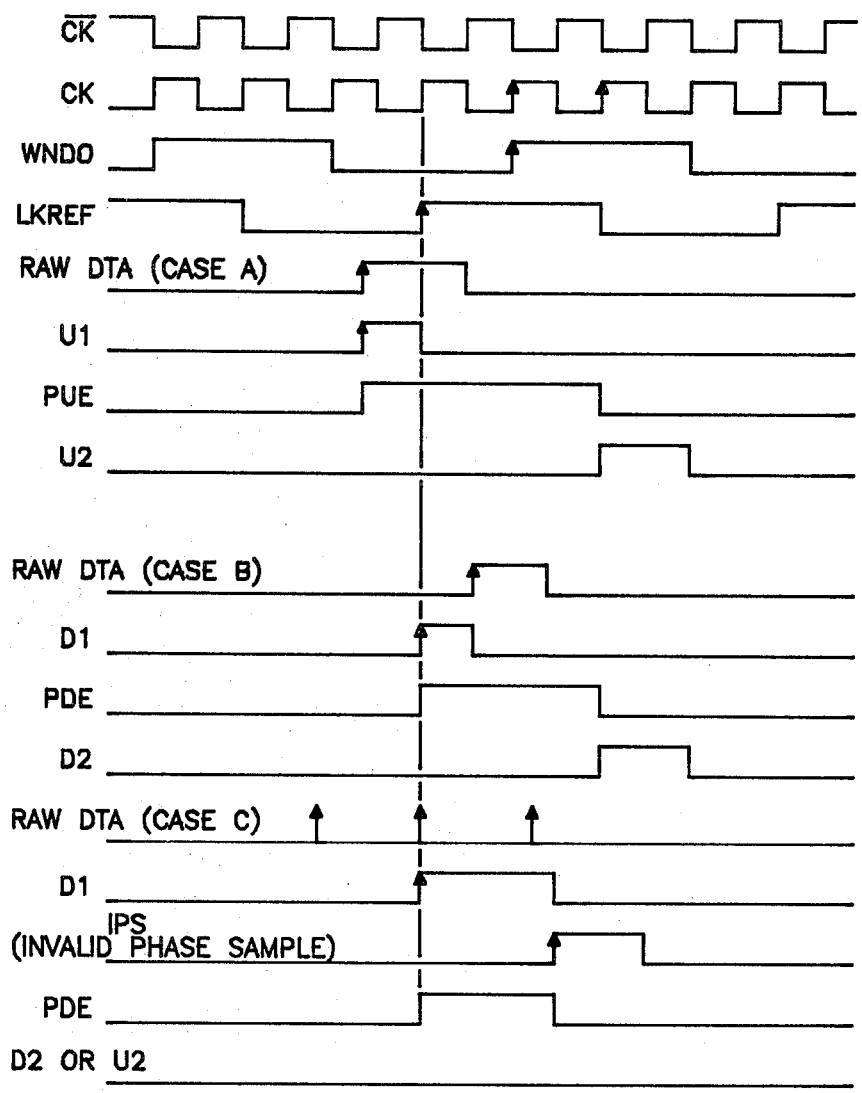
FIG. 9B is a timing diagram relating thereto.

FIGS. 9A and 9B illustrate the window content analyzer logic and associated timing. Referring to FIG. 9A, latches PUE and PDE, 90 and 92 respectively, receive outputs U1 and D1 respectively from the capture phase comparator. Signals PUE and PDE are applied to first inputs of NAND gates 94 and 96 respectively which in turn have outputs coupled to latches 98 and 100 respectively. Latches 98 and 100 are clocked by CK (from the VCO) and are reset by the $\bar{Q}$ output of IPS (invalid phase sample) latch 102. Latches 98 and 100 generate the required U2 and D2 signals. The second input of NAND gates 94 and 96 is coupled to WNDO as is a first input of AND gate 104. The second input of AND gate 104 is coupled to $\overline{MS1}$. Signals WNDO and $\overline{LKREF}$ are applied to first and second inputs of AND gate 106, the output of which is coupled to a first input of NOR gate 108. The second input of NOR gate 108 receives the IPS signal from latch 102, and the output of NOR gate 108 is coupled to the reset inputs of PUE and PDE latches 90 and 92, respectively. While latches 90 and 92 are clocked by U1 and D1 respectively, IPS latch 102 is clocked by CK after inversion by inverter 110.

Latches 90 and 92 (PUE and PDE respectively) capture edge occurrences at inputs U1 and D1, respectively. This temporary memory is then used to enable the transmission of either U2 or D2 during the output interval shown in the timing diagram of FIG. 9B. Three cases are shown. First, case A represents a situation where the raw data pulsed edge leads the pulse edge of LKREF. In this case, U1 is generated as has been described previously. Latch 90 PUE becomes set, and when WNDO goes low, latch 90 is reset and a U2 pulse is generated.

In case B, the raw data edge lags the LKREF edge. As a result, latch 92 (PDE) is set and subsequent thereto a D2 pulse is generated.

Finally, case C illustrates a situation where the raw data edge is either in perfect lock with the rising edge of LKREF or where the data edge falls outside the window. Latch 102 (IPS) detects the presence of D1 high when the window closes and in so doing, inhibits the output of either U2 or D2 pulses. That is, IPS is asserted when no raw data edge occurs within the window.

Figure 10:
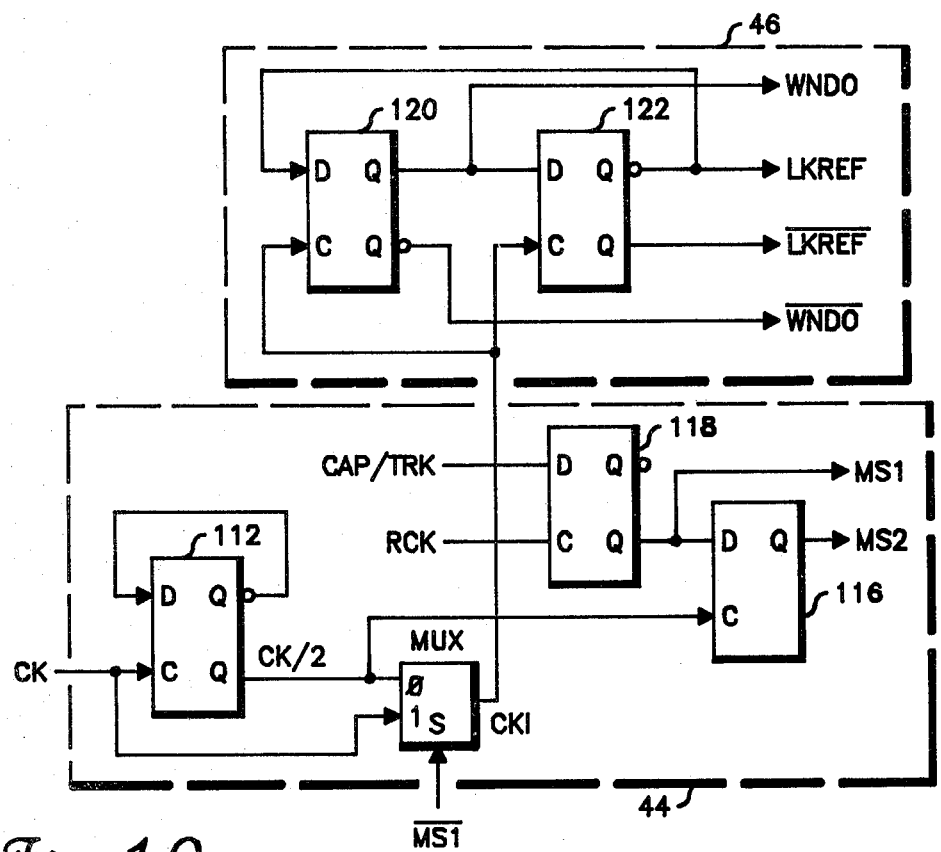
FIG. 10 is a logic diagram illustrating details of the mode control sync logic and sampling window lock reference logic shown in FIG. 3.

FIG. 10 illustrates the logic contained in mode control sync logic 44 and sampling window-lock reference logic 46. The clock signal (CK) derived from the output of the VCO is applied to the clock input of latch 112. The output of latch 112 represents a division of the clock by two. Both CK and CK/2 are applied to inputs of a multiplexer 114 having a select input coupled to $\overline{MS1}$. Multiplexer 114 selects either CK or CK/2 and applies its output to the input of a divide-by-four ring counter comprised of latches 120 and 122. As can be seen, signals WNDO and $\overline{WNDO}$ are generated by latch 120 and signals LKREF and $\overline{LKREF}$ are generated by latch 122. In the tracking mode, the frequency of quadrature signals LKREF and WNDO are doubled since two sampling windows are open for each RCK edge as discussed previously. The CAP/TRK signal from the controller and RCK are applied to latch 118 having an output coupled to latch 116. The clock input of latch 116 is coupled to $\overline{CK/2}$ from latch 112. As can be seen, control signal MS1 is generated at the output of latch 118 while control signal MS2 is generated by latch 116.

Figure 11:
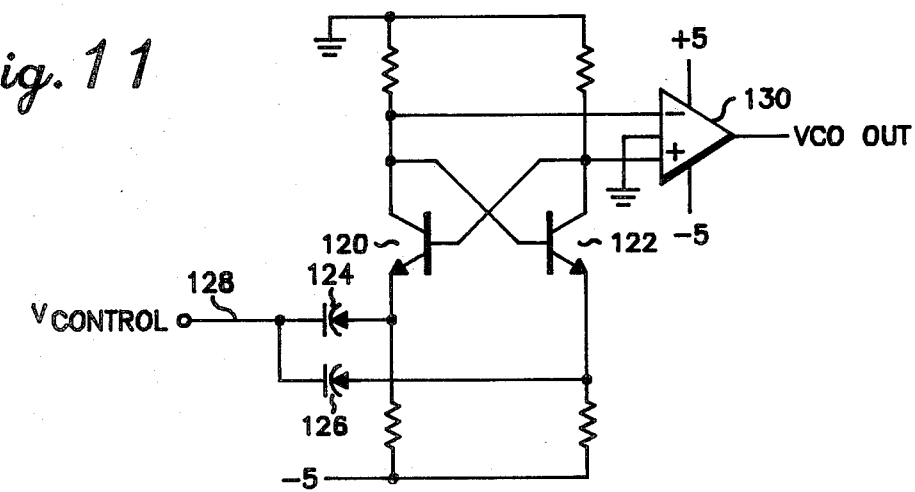
FIG. 11 is a schematic diagram of a voltage controlled oscillator (VCO) for use in the inventive DCRU.

FIG. 11 illustrates one example of a VCO suitable for use in the present invention. The circuit is an astable emitter-coupled multivibrator which utilizes varactor diode capacitance as a tuning element. As can be seen, two cross-coupled transistors 120 and 122 each have their emitters coupled to the anodes of varactor diodes 124 and 126, respectively. The control voltage from the loop filter is applied to node 128. The capacitance of each of the diodes may be modified by using the control voltage to vary the reverse bias of the diodes. This in turn permits the period of the multivibrator to be controlled.

The difference in voltage appearing across the collectors of transistors 120 and 122 is too small to clock logic. Therefore, the collectors of transistors 120 and 122 are coupled to inverting and noninverting inputs, respectively, of a comparator 130; e.g. an NE521. Varactor diode 124 and 126 may be of a type commercially available from Motorola Inc., and bearing part number MV1401.

The VCO circuit shown in FIG. 11 offers control over a wide frequency range since the varactor capacitance is controllable over a 10:1 ratio utilizing current abrupt-junction technology. Another advantage of the circuit resides in the differential pick-off of the output voltage from the transistor collectors by comparator 130. This technique provides an oscillator output which is free from logic noise due to the common mode rejection properties of the differential comparator.

Figure 12:
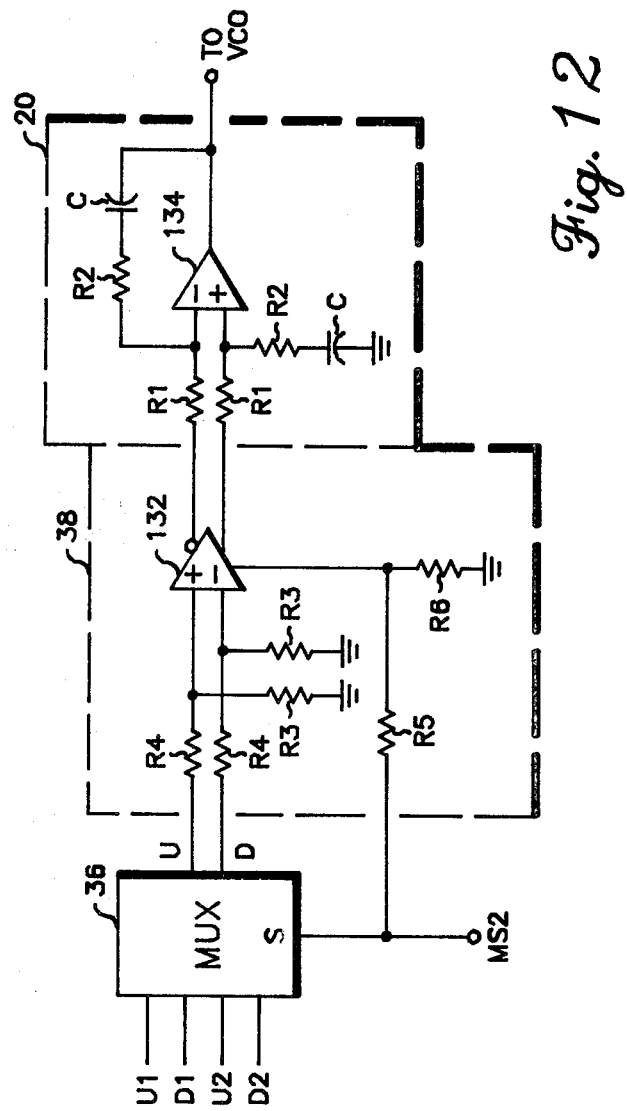
FIG. 12 illustrates in more detail the differential amplifier and loop filter shown in FIGS. 1 and 3.

FIG. 12 illustrates in more detail the phase-to-voltage conversion chain comprising mode select multiplexer 36, difference amplifier 38 and loop filter 20. Multiplexer 36 receives inputs U1, D1, U2, and D2 as described earlier and may be implemented with a dual two-input multiplexer of the type commercially available from Motorola, Inc., and bearing part number LS157. The gain-controlled error pulse difference amplifier 132 may be implemented with an MC1545; i.e. a gated video amplifier also available from Motorola, Inc. Amplifier 132 is preceded by an attenuator divider R3/R4 which gets its inputs (U, D) from multiplexer 36. The overall gain control of the attenuator/amplifier combination is varied by the R5/R6 attenuator voltage into the gain control pin of the amplifier. With the MS2 mode signal at a logic 1 level (the DCRU in the capture mode), the R5/R6 divider voltage produces maximum gain. If MS2 is at a logic zero, minimum gain is achieved.

Loop filter 20 includes an amplifier 134 which may be of a type commercially available from Motorola, Inc., and bears part number MC1741. The output of this amplifier is used to control the VCO.

Figure 13B:
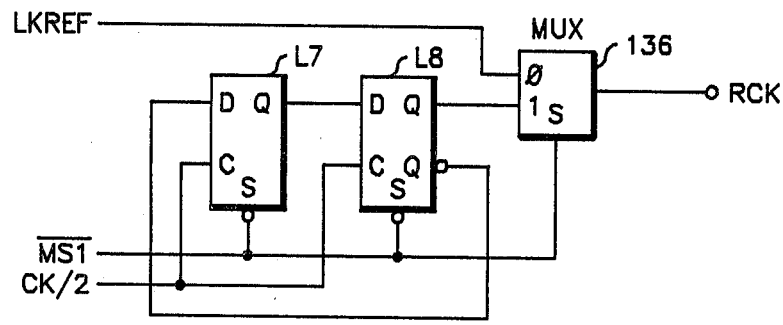
FIGS. 13A and 13B are logic diagrams illustrating the circuitry in the output synchronization logic which generates RCK and RDT.
Figure 13A:
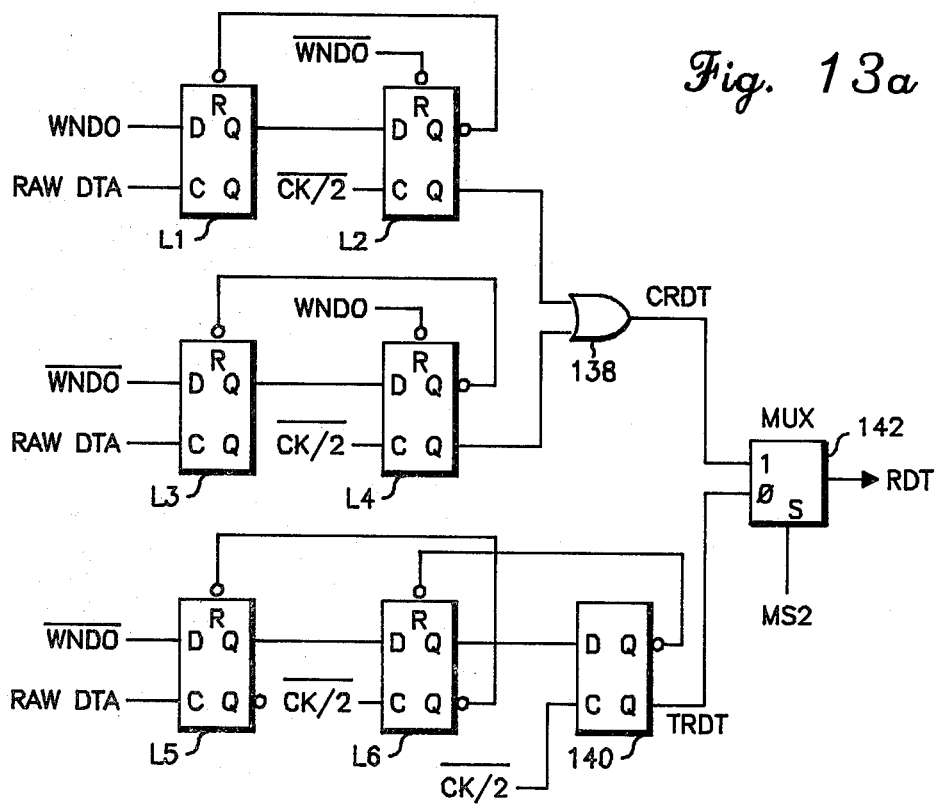

FIG. 13A illustrates that portion of the logic in output synchronization logic 48 which generates the recovered data (RDT) output. It comprises latches L1, L2, L3, L4, L5 and L6, OR gate 138, TRDT latch 140 and multiplexer 142. The raw data is applied to the clock inputs of L1, L3 and L5, and the window (WNDO) is applied to the D input of latches L1, L3 and L5. The outputs of latches L1, L3 and L5 are applied respectively to the D inputs of latches L2, L4 and L6. The outputs of latches L2 and L4 are applied to first and second inputs respectively of OR gate 138, the output of which is applied to a first input of multiplexer 142. The divided clock CK/2 is applied to the clock input of TRDT latch 140 while the output of latch L6 is applied to the D input of latch 140. The output of latch 140 is applied to a second input of multiplexer 142. The select input of multiplexer 142 is coupled to control signal MS2, and the output of multiplexer 142 represents the recovered data (RDT) output generated from the raw data edges sampled during WNDO or $\overline{\text{WNDO}}$ depending on the DCRU mode. The sample edges are latched by latches L1, L3 or L5 to be used by latches L2, L4 or L6 and latch 140 (TRDT) to form the output RDT pulse at a time which bounds the next available RCK edge. The RDT output pulse width is one CK/2 period.

FIG. 13B illustrates that portion of the logic circuitry in output synchronization logic 48 which is responsible for producing the RCK output. It is to be noted that the RCK output is identical to LKREF during the capture mode and is equal to LKREF/2 during the tracking mode. This is necessary since the frequency of LKREF and WNDO double during the tracking mode. As can be seen, the circuit comprises two latches, L7 and L8. The divided clock (CK/2) is applied to the clock inputs of both L7 and L8, and $\overline{\text{MS1}}$ is applied to the D inputs of L7 and L8 and to the select input of multiplexer 136. The output of latch L8 is coupled to a first input of multiplexer 136, and LKREF is coupled to the second input of multiplexer 136. The recovered clock (RCK) appears at the output of multiplexer 136.

Figure 14A:
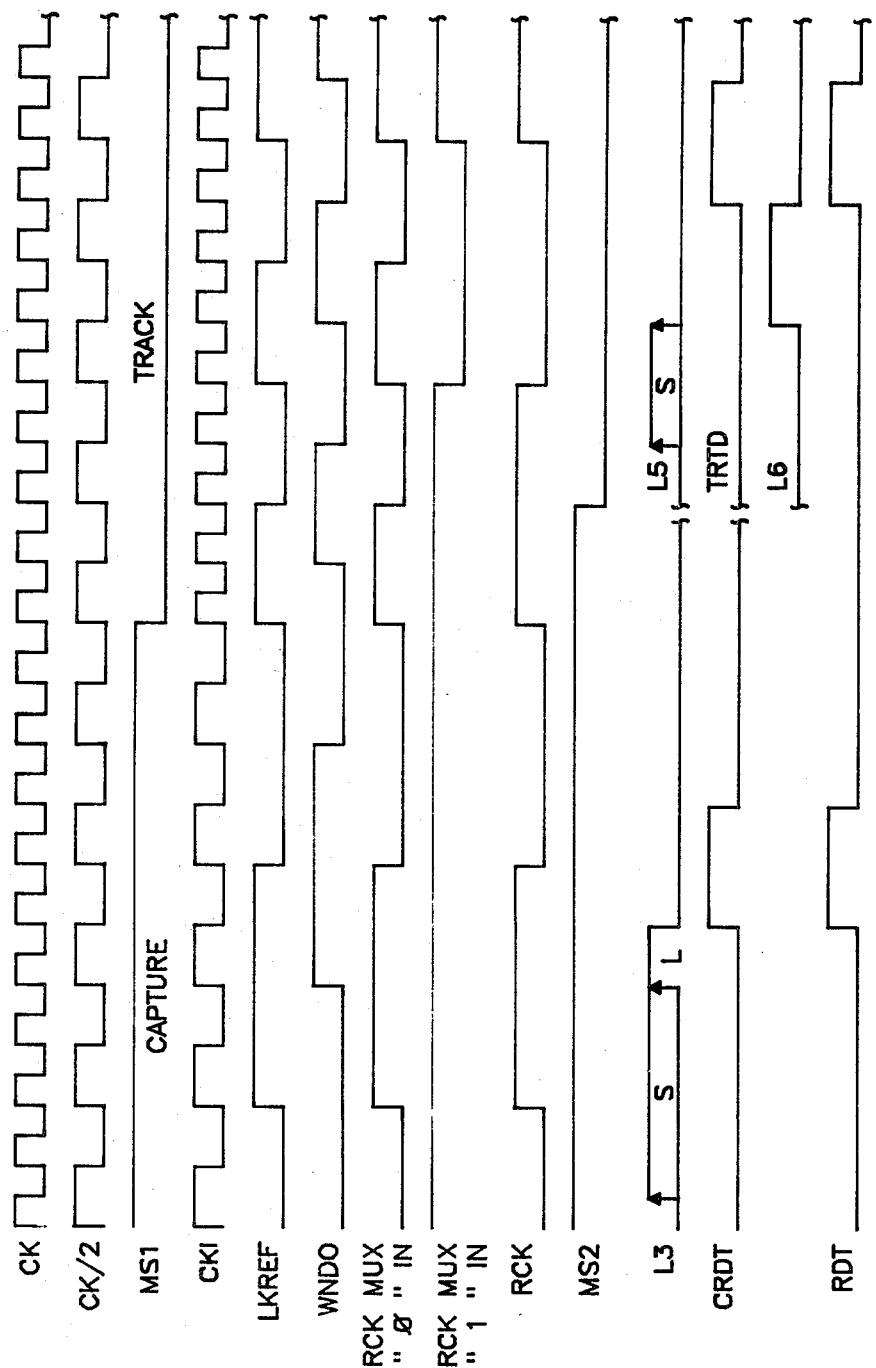
FIGS. 14A and 14B are timing diagrams which illustrate the synchronization relationships when switching the DCRU from the capture mode to the tracking mode and from the tracking mode to the capture mode respectively.
Figure 14B:
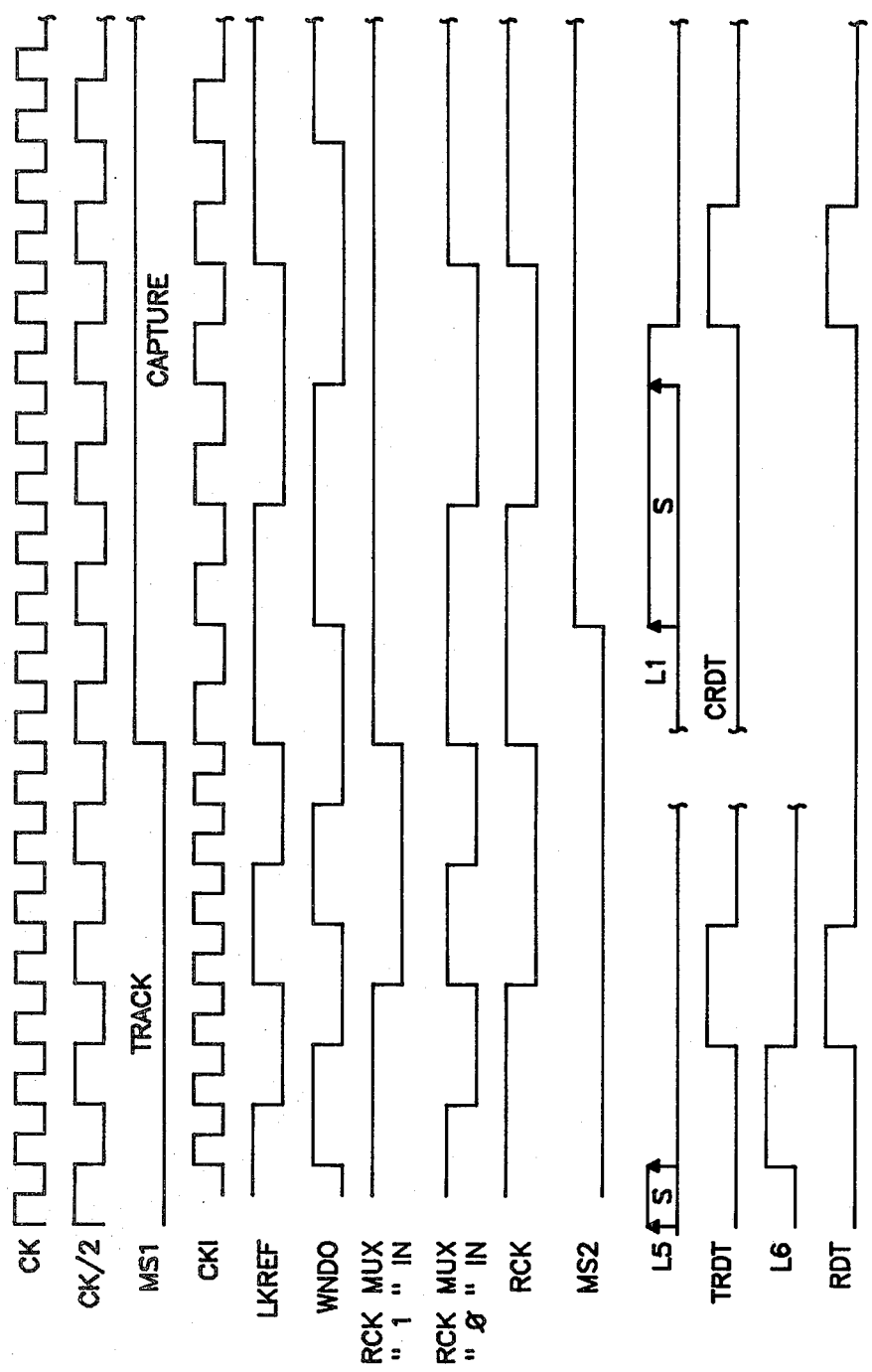

FIGS. 14A and 14B are timing diagrams which illustrate the synchronization relationships when switching the DCRU from the capture mode to the tracking mode and from the tracking mode to the capture mode, respectively. Raw data sampling is represented by intervals labeled "S," and latched sampled data is indicated by intervals labeled "L."

The above description is given by way of example only. Changes in form and details may be made by one skilled in the art without departing from the scope of the invention as defined by the appending claims.

We claim:

1. A phase-lock-loop circuit for generating a reference signal which is in phase with an input signal, comprising:
   comparing means for receiving said reference signal and said input signal and for generating at an output an error signal indicative of the phase difference between said reference signal and said input signal;
   first means having an input coupled to the error signal from said comparing means for generating said reference signal, said first means being responsive to said error signal for bringing said reference signal into phase with said input signal;
   second means coupled between the output of said comparing means and the input of said first means for inhibiting said error signal if said input signal occurs either earlier or later than a predetermined interval of time; and
   third means coupled to said comparing means and to said second means for generating a window during which receipt of an input signal which is out of phase with said reference signal will result in the generation of said error signal, the duration of said window corresponding to said predetermined interval of time wherein said input signal is one of a plurality of input pulses, said reference signal is one of a plurality of reference pulses, said window corresponds to a first state of a window signal capable of alternately assuming first and second states and wherein said error signal corresponds to a plurality of error pulses one of which is generated each time out-of-phase input and reference pulses are received during said first state.

2. A circuit according to claim 1 further including fourth means coupled to said comparing means for extracting a dc control voltage from said plurality of error pulses.

3. A circuit according to claim 1 wherein said reference signal and said window signal are in phase quadrature to define first and second halves of said window.

4. A circuit according to claim 3 wherein said comparing means includes means for generating a first type error pulse if said input pulse occurs in the first half of the window and a second type error pulse if said input pulse occurs in the second half of said window.

5. A circuit according to claim 2 wherein said first means comprises a voltage controlled oscillator coupled to said fourth means and responsive to said dc control voltage.

6. A circuit according to claim 5 wherein said voltage controlled oscillator comprises:
   an astable multivibrator; and
   varactor diode means coupled to said multivibrator and responsive to said control voltage for changing the period thereof in response to capacitance changes in said varactor diode means caused by changes in said control voltage.

7. A data recovery system for capturing and tracking a serial data stream including a synchronization field and clock bits interleaved with data bits, comprising:
   phase lock loop means for synchronizing a reference signal with said synchronization field during a capture mode of operation and for tracking said clock and data bits during a tracking mode of operation;
   first means coupled to said phase lock loop means, for decreasing the dynamic response time of said loop means during said capture mode to achieve rapid phase and frequency lock to said synchronization field and for increasing the dynamic response time of said loop means during said tracking mode, wherein said phase lock loop means comprises:
   a comparator for receiving bits of said data stream and said reference signal and for generating error pulses of a first type indicative of the phase difference between one of said bits and said reference signal;
   second means coupled to said comparator and responsive to the error pulses of said first type for generating error pulses of a second type if said one of said bits occurs within a predetermined time interval;
   differential amplifying means;
   multiplexing means having inputs coupled to said comparator and to said second means and having outputs coupled to said differential amplifying means for selecting error pulses of said first type in said capture mode and for selecting error pulses of said second type in said tracking mode;
   filter means coupled to said differential amplifying means for extracting a dc control voltage from said error pulses; and
   third means coupled to said filter means for generating said reference signal, said third means being responsive to said dc control voltage for bringing said reference signal into phase with said data stream.

8. A system according to claim 7 wherein said error pulses of said first type have widths which are proportional to the phase difference between said clock and data bits and said reference signal.

9. A system according to claim 8 wherein said error pulses of said second type have constant widths.

10. A system according to claim 8 wherein said first means includes means for varying the gain of said differential amplifying means.

11. A system according to claim 10 wherein said third means includes a voltage controlled oscillator coupled to said filter means and having an operating frequency which is varied by said control voltage.

12. A system according to claim 11 wherein said voltage controlled oscillator comprises:
an astable multivibrator; and
varactor diode means coupled to said multivibrator and responsive to said control voltage for changing the period thereof in response to capacitance changes in said varactor diode means caused by changes in said control voltage.

13. A data recovery system including a phase lock loop to capture and track a serial data stream including a synchronization field and clock bits interleaved with data bits, comprising:
first means for generating a reference signal;
comparison means coupled to said first means for receiving said data stream and said reference signal and for generating error pulses of a first type indicative of the phase difference between bits of said data stream and pulses of said reference signal;
second means coupled to said comparison means and responsive to the error pulses of said first type for generating error pulses of a second type if each of said bits occurs during predetermined intervals;
third means coupled to both said first and second means, for selecting the error pulses of said first type when said system is operating in a capture mode and for selecting the error pulses of said second type when said system is operating in a tracking mode;
differential amplifying means coupled to the error pulses from said third means, for amplifying said error pulses of said third means;
fourth means coupled to said differential amplifying means, for decreasing the dynamic response time of said loop in said capture mode and for increasing the dynamic response time of said loop in said tracking mode; and
fifth means responsive to said error pulses from said differential amplifying means for altering said reference signal to bring said reference signal into phase with said data bits.

14. A system according to claim 13 wherein the error pulses of said first type have widths which are proportional to phase difference.

15. A system according to claim 14 wherein said fifth means includes filter means for extracting a dc control voltage from said error pulses.

16. A system according to claim 14 wherein said fourth means includes means for varying the gain of said differential amplifying means.

* * * * *